(12) United States Patent
Leung

(10) Patent No.: US 12,084,252 B2
(45) Date of Patent: Sep. 10, 2024

(54) TOP-LOAD ELECTROSTATIC DISCHARGE BAG FOR COMPONENTS

(71) Applicant: Juniper Networks, Inc., Sunnyvale, CA (US)

(72) Inventor: Jimmy Chun-Chuen Leung, Fremont, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 18/063,210

(22) Filed: Dec. 8, 2022

(65) Prior Publication Data
US 2024/0190637 A1    Jun. 13, 2024

(51) Int. Cl.
| | |
|---|---|
| *B65D 81/00* | (2006.01) |
| *B65D 75/00* | (2006.01) |
| *B65D 85/30* | (2006.01) |
| *H05F 1/00* | (2006.01) |

(52) U.S. Cl.
CPC .......... *B65D 81/00* (2013.01); *B65D 75/008* (2013.01); *B65D 85/30* (2013.01); *H05F 1/00* (2013.01)

(58) Field of Classification Search
CPC ...... B65D 75/008; B65D 81/00; B65D 85/30; H05F 1/00
USPC ....................... 206/720; 383/85, 88, 104, 120
See application file for complete search history.

(56) References Cited

U.S. PATENT DOCUMENTS

| | | | |
|---|---|---|---|
| 1,920,322 A * | 8/1933 | Rosmait | B65D 33/26 383/85 |
| 4,328,895 A * | 5/1982 | Jaeger | A24F 19/0028 383/104 |
| 4,773,534 A | 9/1988 | Deheras et al. | |
| 4,865,197 A | 9/1989 | Craig | |
| 4,898,477 A * | 2/1990 | Cox | B65D 33/007 383/104 |
| 5,097,949 A * | 3/1992 | Heldwein | H01L 21/67396 206/720 |

(Continued)

FOREIGN PATENT DOCUMENTS

| | | | | |
|---|---|---|---|---|
| EP | 699599 A1 * | 3/1996 | | B32B 1/02 |
| WO | 2014082026 A1 | 5/2014 | | |

OTHER PUBLICATIONS

Extended European Search Report for Application No. EP23154608.6, mailed on Aug. 25, 2023, 14 pages.

*Primary Examiner* — Bryon P Gehman
(74) *Attorney, Agent, or Firm* — Harrity & Harrity, LLP

(57) ABSTRACT

An electrostatic discharge bag may include a bottom portion, and a front portion integrally connected to the bottom portion and including a first inside-out creased edge. The electrostatic bag may include a first side portion integrally connected to the bottom portion and the front portion and including a second inside-out creased edge and a first pair of outside-in creased edges, and a second side portion integrally connected to the bottom portion and the front portion and including a third inside-out creased edge and a second pair of outside-in creased edges. The first and second pairs of outside-in creased edges may enable the electrostatic discharge bag to collapse inward and downward toward the bottom portion. The electrostatic discharge bag may include a rear portion integrally connected to the bottom portion, the first side portion, and the second side portion and including a fourth inside-out creased edge.

20 Claims, 11 Drawing Sheets

(56) References Cited

U.S. PATENT DOCUMENTS

| | | | | |
|---|---|---|---|---|
| 5,854,733 A | * | 12/1998 | Jerkins | H05F 3/02 |
| | | | | 206/720 |
| 8,790,230 B2 | * | 7/2014 | Piraneo | B65D 31/10 |
| | | | | 493/219 |
| 2008/0265009 A1 | | 10/2008 | Katoh | |
| 2018/0148246 A1 | | 5/2018 | Fu et al. | |

\* cited by examiner

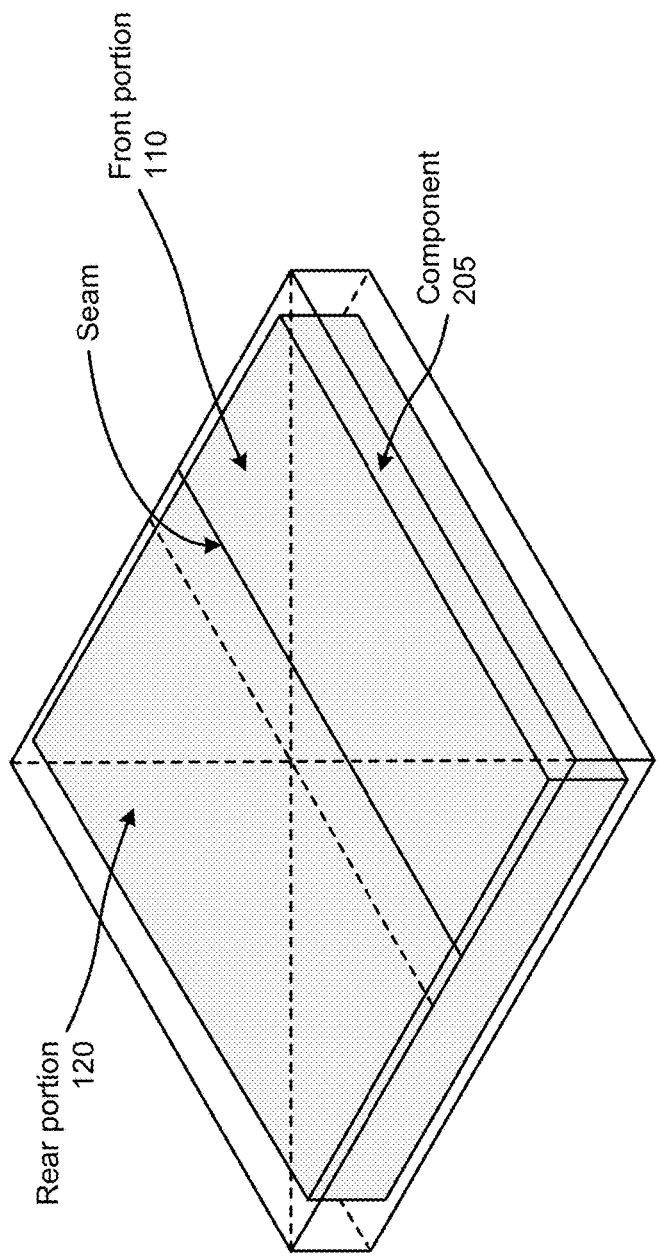

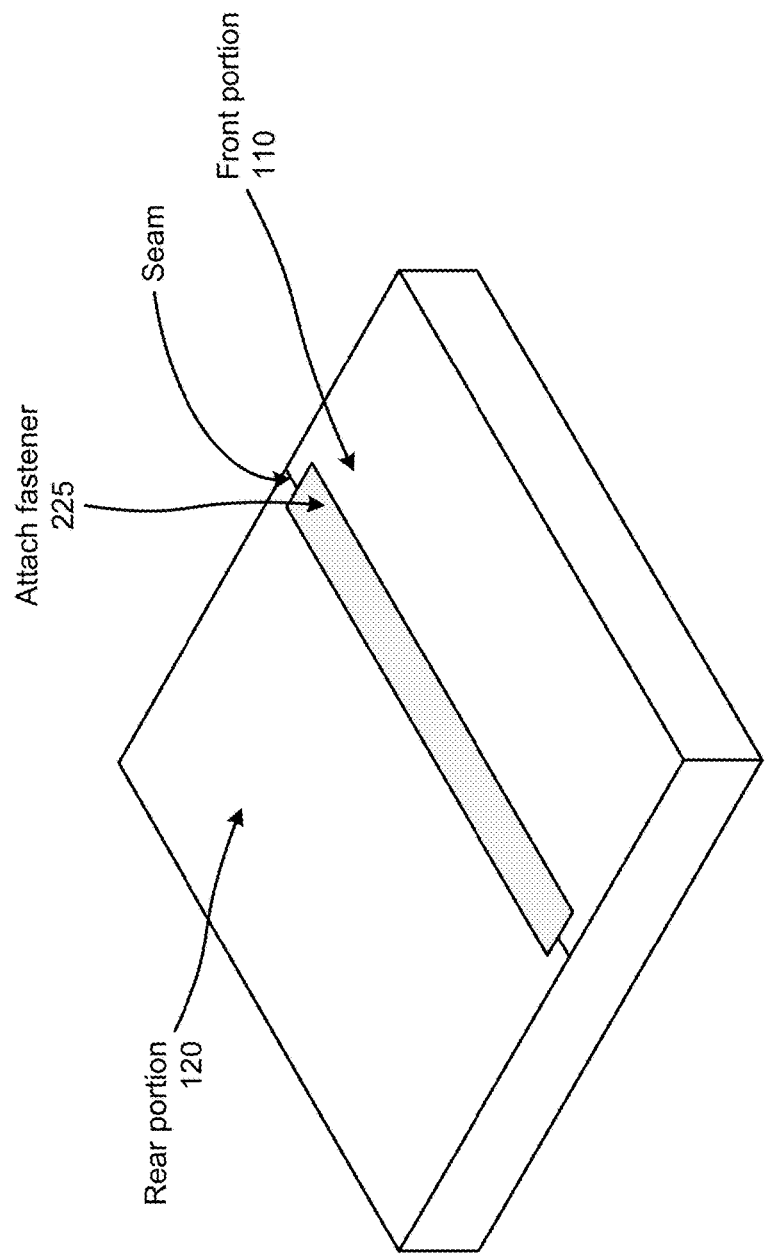

TOP-LOAD ELECTROSTATIC DISCHARGE BAG FOR COMPONENTS

BACKGROUND

Components for a network device (e.g., a router, a gateway, a switch, a firewall, a hub, a bridge, a reverse proxy, a server, and/or the like) may be replaceable. However, many components (e.g., field-replaceable units (FRUs)) are larger and have become much heavier.

SUMMARY

Some implementations described herein relate to an electrostatic discharge bag. The electrostatic discharge bag may include a bottom portion, and a front portion integrally connected to the bottom portion and including a first inside-out creased edge. The electrostatic discharge bag may include a first side portion integrally connected to the bottom portion and the front portion and including a second inside-out creased edge and a first pair of outside-in creased edges, and a second side portion integrally connected to the bottom portion and the front portion and including a third inside-out creased edge and a second pair of outside-in creased edges. The first pair of outside-in creased edges and the second pair of outside-in creased edges may enable the electrostatic discharge bag to collapse inward and downward toward the bottom portion. The electrostatic discharge bag may include a rear portion integrally connected to the bottom portion, the first side portion, and the second side portion and including a fourth inside-out creased edge.

Some implementations described herein relate to a system. The system may include a component and an electrostatic discharge bag that includes a bottom portion for supporting the component, and a front portion integrally connected to the bottom portion and including a first inside-out creased edge. The electrostatic discharge bag may include a first side portion integrally connected to the bottom portion and the front portion and including a second inside-out creased edge and a first pair of outside-in creased edges, and a second side portion integrally connected to the bottom portion and the front portion and including a third inside-out creased edge and a second pair of outside-in creased edges. The first pair of outside-in creased edges and the second pair of outside-in creased edges may enable the electrostatic discharge bag to collapse inward and downward toward the component supported by the bottom portion. The electrostatic discharge bag may include a rear portion integrally connected to the bottom portion, the first side portion, and the second side portion and including a fourth inside-out creased edge.

Some implementations described herein relate to a method. The method may include providing a component in an electrostatic discharge bag that includes a bottom portion for supporting the component, a front portion integrally connected to the bottom portion and including a first inside-out creased edge, a first side portion integrally connected to the bottom portion and the front portion and including a second inside-out creased edge and a first pair of outside-in creased edges, a second side portion integrally connected to the bottom portion and the front portion and including a third inside-out creased edge and a second pair of outside-in creased edges, and a rear portion integrally connected to the bottom portion, the first side portion, and the second side portion and including a fourth inside-out creased edge. The method may include forcing the first side portion and the second side portion inward based on the first pair of outside-in creased edges and the second pair of outside-in creased edges to cause the electrostatic discharge bag to collapse inward and downward toward the component. The method may include overlapping the rear portion over the front portion to form a seam, and applying an adhesive material to the seam to seal the component in the electrostatic discharge bag.

BRIEF DESCRIPTION OF THE DRAWINGS

FIGS. 2A-2D are diagrams of example steps for providing and storing a component (e.g., a field-replaceable unit (FRU)) in the ESD bag depicted in FIGS. 1A-1F.

DETAILED DESCRIPTION

Figure 1A:
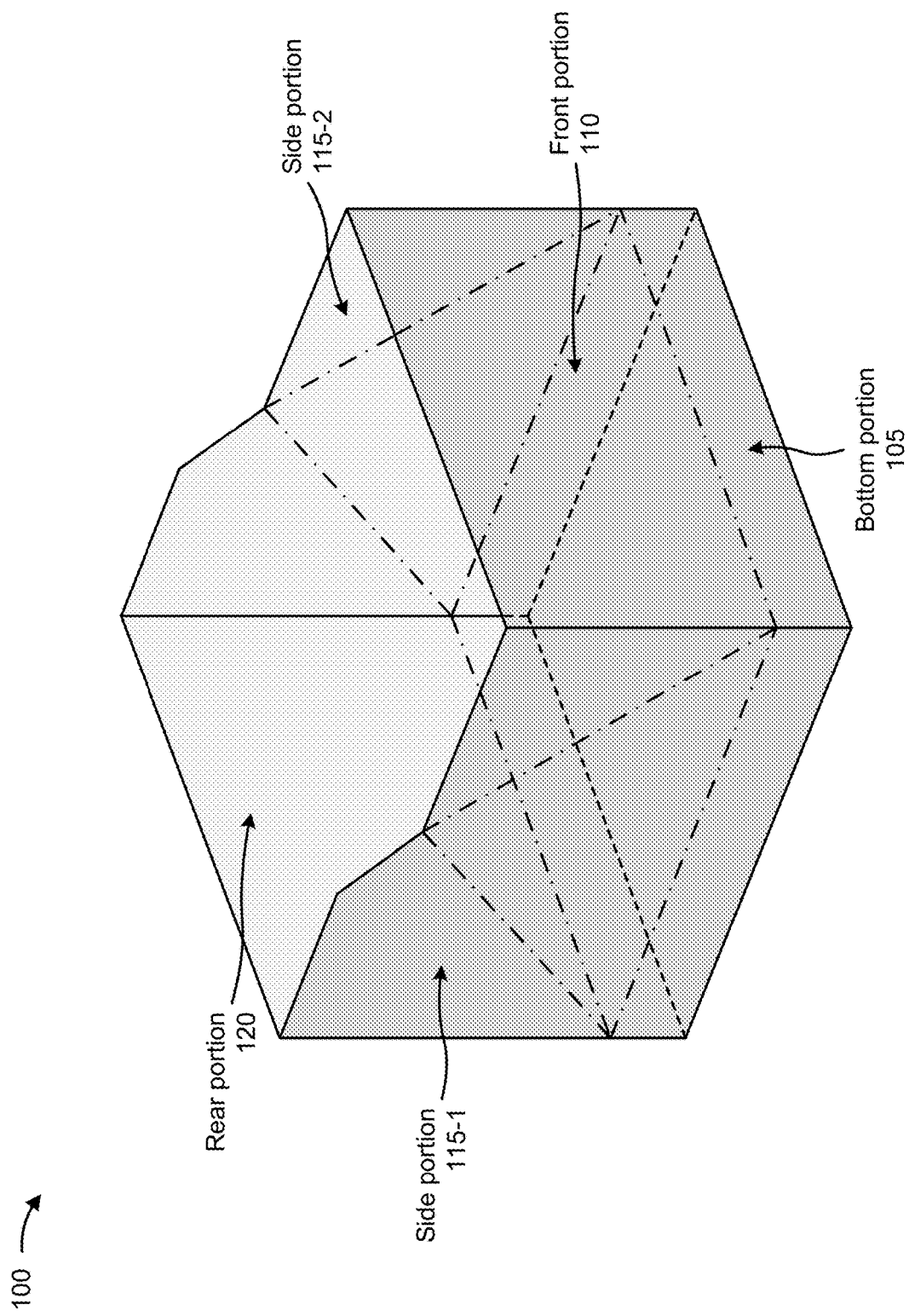
FIGS. 1A-1F are diagrams of different views of an example top-load electrostatic discharge (ESD) bag.

The following detailed description of example implementations refers to the accompanying drawings. The same reference numbers in different drawings may identify the same or similar elements.

Field-replaceable units (FRUs) may be stored in electrostatic discharge (ESD) bags and shipped to clients requiring the FRUs. However, getting the FRUs in and out of such ESD bags has become more difficult especially when handled by a single person. For example, one of the person's hands may be occupied with keeping the ESD bag open while the other hand of the person may hold a large and heavy FRU and attempt to insert the FRU into the ESD bag. When a single person attempts to remove the large and heavy FRU from the ESD bag with one hand, often times an end of the FRU may drag inside the ESD bag and across a surface (e.g., a surface of a bench). This difficult maneuver may lead to costly damage to vulnerable components (e.g., connectors) of the FRU. Thus, current techniques for handling FRUs with ESD bags may result in damaged FRUs, inoperable FRUs, malfunctioning FRUs, and/or the like.

Some implementations described herein relate to a top-load ESD bag for large and heavy components. For example, the ESD bag may include a bottom portion, and a front portion integrally connected to the bottom portion and including a first inside-out creased edge. The ESD bag may include a first side portion integrally connected to the bottom portion and the front portion and including a second inside-out creased edge and a first pair of outside-in creased edges, and a second side portion integrally connected to the bottom portion and the front portion and including a third inside-out creased edge and a second pair of outside-in creased edges. The first pair of outside-in creased edges and the second pair of outside-in creased edges may enable the ESD bag to collapse inward and downward toward the bottom portion. The ESD bag may include a rear portion integrally connected to the bottom portion, the first side portion, and the second side portion and including a fourth inside-out creased edge.

In this way, the top-load ESD bag may provide a safe and effective way to store and ship large and heavy components. For example, the ESD bag may prevent damage to FRUs and may address handling challenges associated with providing large and heavy FRUs in and out of the ESD bag. This may enhance the client experience and avoid unintentional FRU damage from mishandling. The ESD bag may include an open-top box design with predefined creases for easy and consistent wrapping and unwrapping of an FRU. The ESD bag may simplify the FRU handling process based on loading and unloading the FRU into and from the ESD bag and based on wrapping and unwrapping the FRU with the ESD bag. The ESD bag may include a fully open top and four sides that are self-standing, which enables a single person to place an FRU into the ESD bag with both hands, allowing for more control. The predefined creases of the ESD bag may allow the person to use both hands to simultaneously push against two sides of the ESD bag, causing the ESD bag to collapse onto itself. Finally, a single piece of adhesive material (e.g., tape) may be utilized to hold the ESD bag closed. Thus, the top-load ESD bag may prevent costly damage to vulnerable components (e.g., connectors) of FRUs, and may prevent causing inoperable FRUs, malfunctioning FRUs, and/or the like.

FIGS. 1A-1F are diagrams of different views of an example top-load ESD bag 100. FIG. 1A depicts an isometric view of the ESD bag 100. As shown in FIG. 1A, the ESD bag 100 may include a box-like design with an open top for receiving a component, such as an FRU. The ESD bag 100 may be integrally formed of an ESD material, such as a static shielding film material. In some implementations, the ESD bag 100 may be integrally formed of a plastic polyethylene terephthalate (PET) with a static dissipative coating or layer on the plastic. The static dissipative coating may prevent buildup of a static charge on the surface of the ESD bag 100, as it dissipates a charge to ground (e.g., whatever other surface the ESD bag 100 is touching).

As further shown in FIG. 1A, the ESD bag 100 may include a bottom portion 105, and a front portion 110 integrally connected to the bottom portion 105 and including a first inside-out creased edge (e.g., as shown by the horizontal dot-dash line). The first inside-out creased edge may enable the front portion 110 to collapse inward and downward towards the bottom portion 105. The dashed lines in FIG. 1A indicate hidden lines delineating the bottom portion 105 of the ESD bag 100. The ESD bag 100 may include a first side portion 115-1 integrally connected to the bottom portion 105 and the front portion 110 and including a second inside-out creased edge (e.g., as shown by the horizontal dot-dash line) and a first pair of outside-in creased edges (e.g., as shown by the angled dot-dash lines). The second inside-out creased edge and the first pair of outside-in creased edges may enable the first side portion 115-1 to collapse inward and downward towards the bottom portion 105.

As further shown in FIG. 1A, the ESD bag 100 may include a second side portion 115-2 integrally connected to the bottom portion 105 and the front portion 110 and including a third inside-out creased edge (e.g., as shown by the horizontal dot-dash line) and a second pair of outside-in creased edges (e.g., as shown by the angled dot-dash lines). The third inside-out creased edge and the second pair of outside-in creased edges may enable the second side portion 115-2 to collapse inward and downward towards the bottom portion 105. The ESD bag 100 may include a rear portion 120 integrally connected to the bottom portion 105, the first side portion 115-1, and the second side portion 115-2 and including a fourth inside-out creased edge (e.g., as shown by the horizontal dot-dash line). The fourth inside-out creased edge may enable the rear portion 120 to collapse inward and downward towards the bottom portion 105. In some implementations, each of the bottom portion 105, the front portion 110, the first side portion 115-1, the second side portion 115-2, and the rear portion 120 includes a thickness that is greater than or equal to 0.0762 millimeters.

Figure 1B:
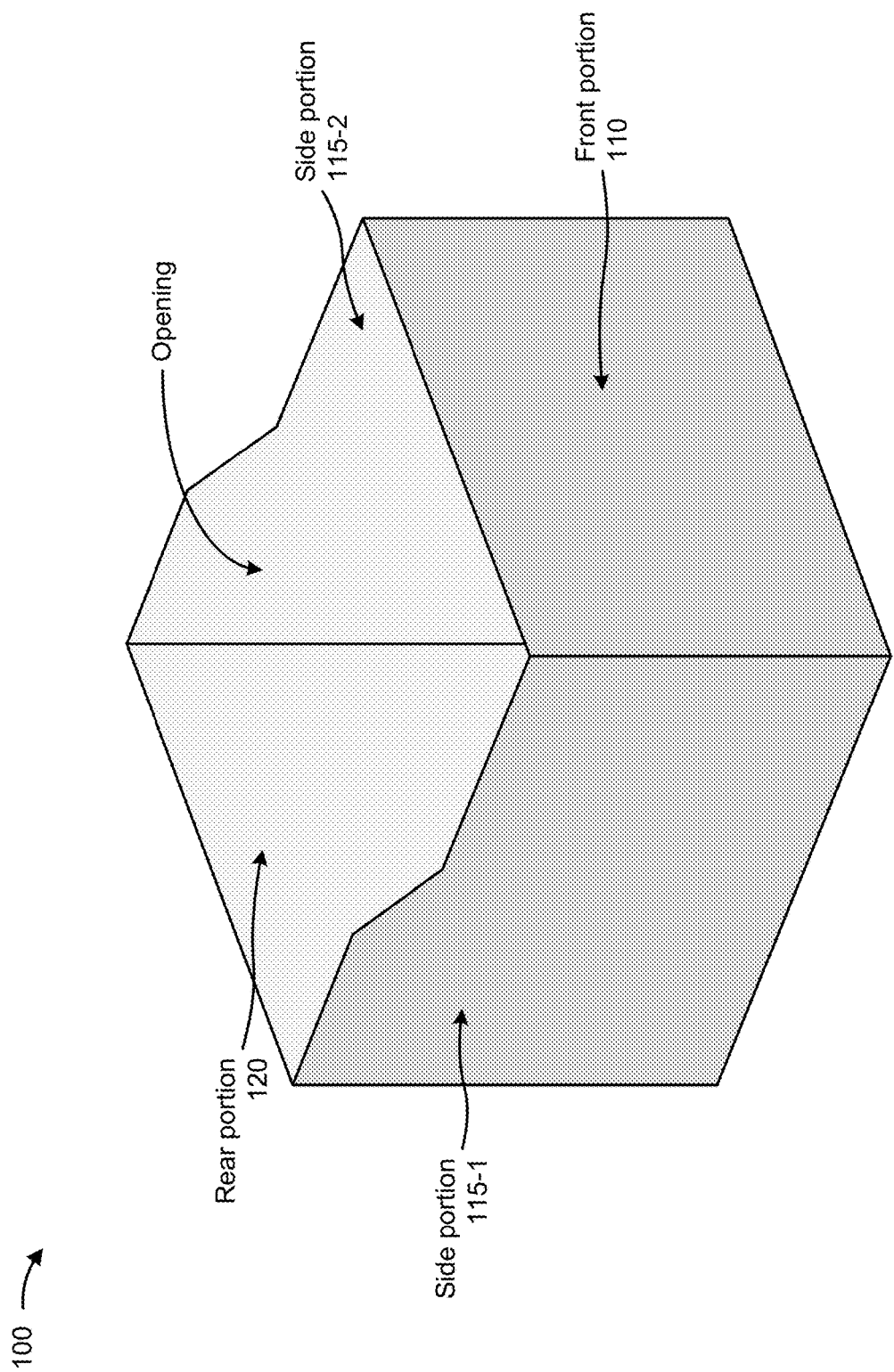

FIG. 1B depicts an isometric view of the ESD bag 100, without the hidden lines, the inside-out creased edges, or the outside-in creased edges. As further shown, the front portion 110, the first side portion 115-1, the second side portion 115-2, and the rear portion 120 may form an opening for the ESD bag 100. The ESD bag 100 may receive a component for storage and protection (e.g., from ESD) in the ESD bag 100 via the opening. In some implementations, the ESD bag 100 is self-standing for receiving a component, and may be sized and/or shaped based on a size and/or a shape of a component to be provided in the ESD bag 100. In some implementations, a height of the rear portion 120 may be greater than a height of the front portion 110. The ESD bag 100 may wrap a component based on the first pair of outside-in creased edges (e.g., of the first side portion 115-1) and the second pair of outside-in creased edges (e.g., of the second side portion 115-2) collapsing inward and downward toward the bottom portion 105.

Figure 1C:
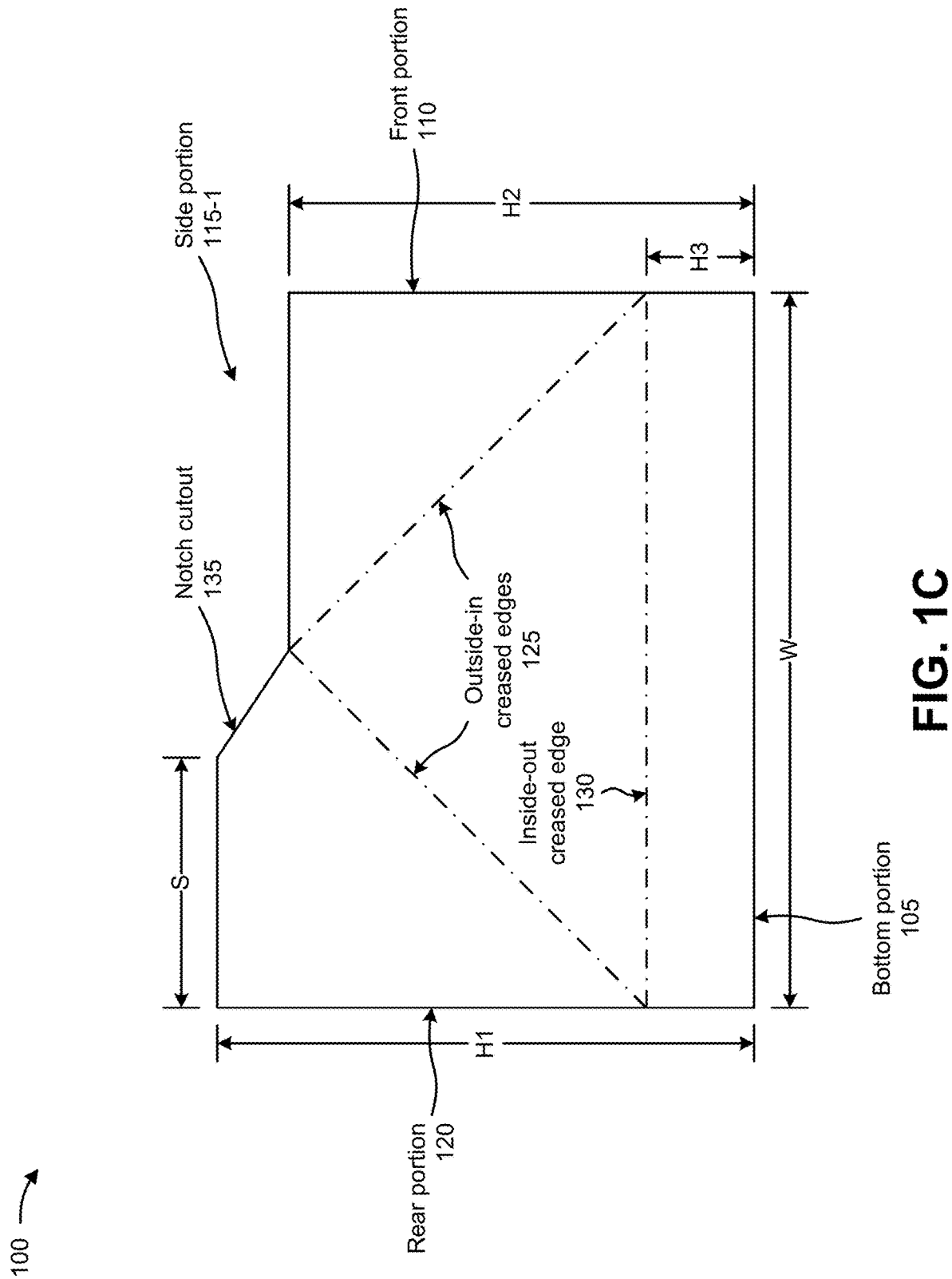

FIG. 1C is a left-side view of the ESD bag 100 that depicts the first side portion 115-1 of the ESD bag 100. In some implementations, the first side portion 115-1 may include the same or similar features as the second side portion 115-2. As shown in FIG. 1C, the first side portion 115-1 may include a pair of outside-in creased edges 125 (e.g., as shown by the angled dot-dash lines that converge toward a top edge of the first side portion) and an inside-out creased edge 130 (e.g., as shown by the horizontal dot-dash line). The first portion 115-1 and the bottom portion 105 may include a width (W) that depends on a size and/or a shape of the component to be stored in the ESD bag 100. In some implementations, the width (W) may be greater than or equal to 50.8 centimeters.

As further shown in FIG. 1C, a first section of the first side portion 115-1 that is connected to the rear portion 120 may include a first height (H1) that depends on a size and/or a shape of the component to be stored in the ESD bag 100. In some implementations, the first height (H1) may be greater than or equal to 38.1 centimeters. A second section of the first side portion 115-1 that is connected to the front portion 110 may include a second height (H2) that depends on a size and/or a shape of the component to be stored in the ESD bag 100. In some implementations, the second height (H2) may be greater than or equal to 32.512 centimeters. In some implementations, the first height (H1) is greater than the second height (H2) and the first side portion 115-1 includes a notch cutout 135 that includes a length (S) at the first height (H1). In some implementations, the length (S) may be greater than or equal to 17.78 centimeters. The inside-out creased edge 130 of the first side portion 115-1 may be provided at a third height (H3) that depends on a size and/or a shape of the component to be stored in the ESD bag 100. In some implementations, the third height (H3) may be greater than or equal to 7.112 centimeters.

Figure 1D:
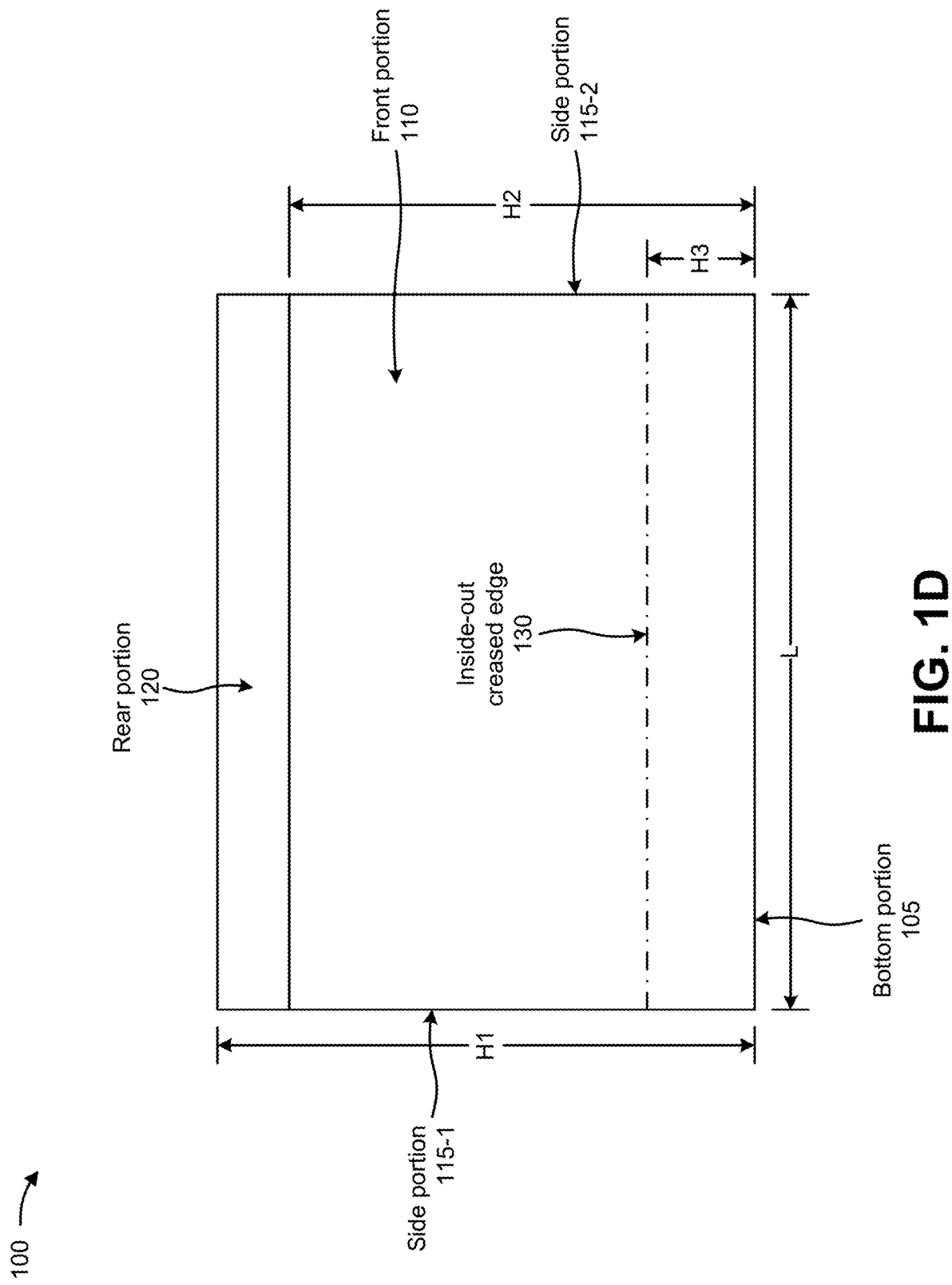

FIG. 1D is a front view of the ESD bag 100 that depicts the front portion 110 of the ESD bag 100. As shown in FIG. 1D, the front portion 110 may include an inside-out creased edge 130 (e.g., as shown by the horizontal dot-dash line). The inside-out creased edge 130 of the front portion 110 may be provided at the third height (H3) that depends on a size and/or a shape of the component to be stored in the ESD bag 100. In some implementations, the third height (H3) may be greater than or equal to 7.112 centimeters. The front portion 110 and the bottom portion 105 may include a length (L) that depends on a size and/or a shape of the component to be stored in the ESD bag 100. In some implementations, the length (L) may be greater than or equal to 50.8 centimeters.

Figure 1E:
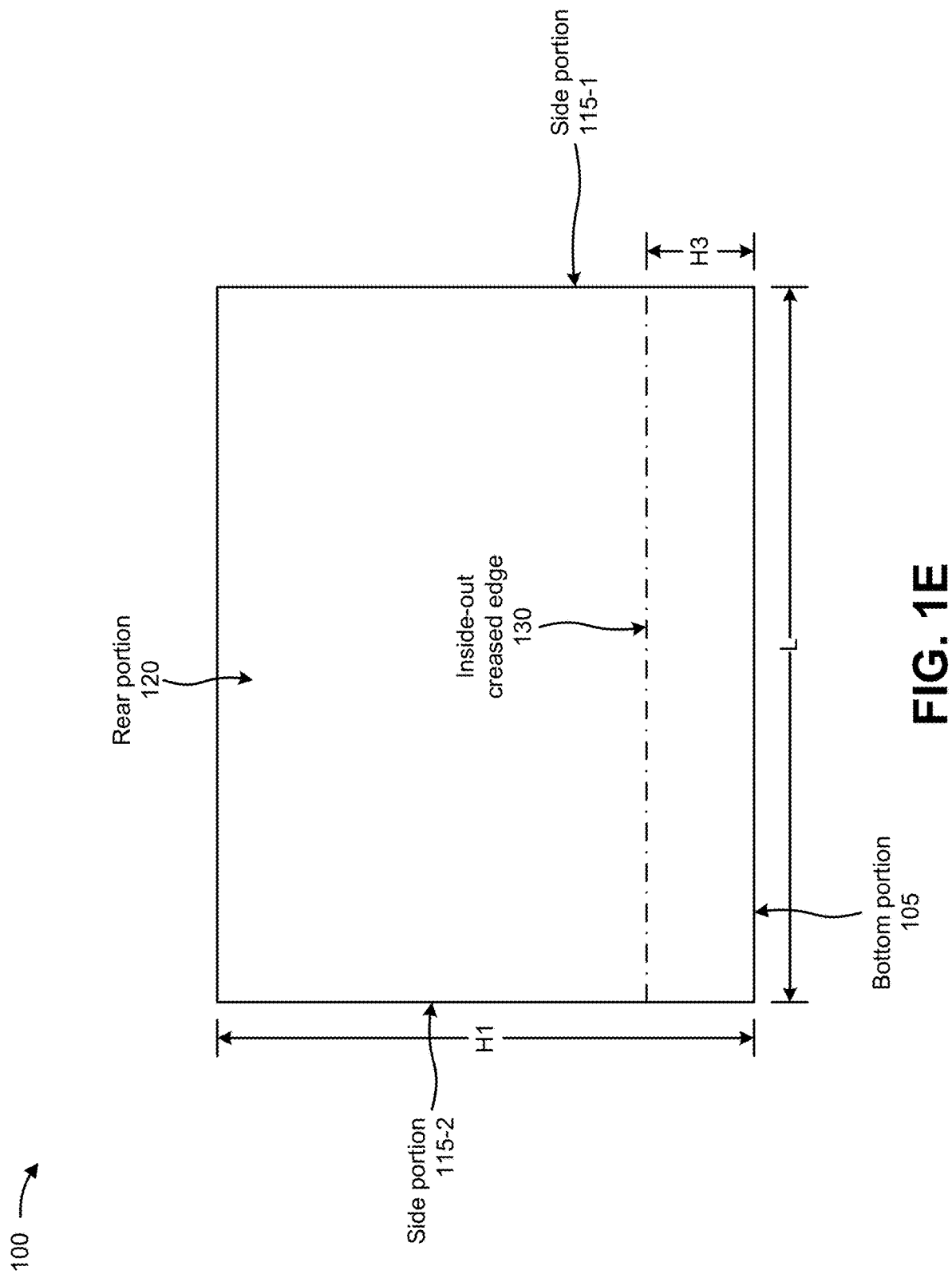

FIG. 1E is a rear view of the ESD bag 100 that depicts the rear portion 120 of the ESD bag 100. As shown in FIG. 1E, the rear portion 120 may include an inside-out creased edge 130 (e.g., as shown by the horizontal dot-dash line). The inside-out creased edge 130 of the rear portion 120 may be provided at the third height (H3) that depends on a size and/or a shape of the component to be stored in the ESD bag 100. In some implementations, the third height (H3) may be greater than or equal to 7.112 centimeters. The rear portion 120 and the bottom portion 105 may include the length (L) that depends on a size and/or a shape of the component to be stored in the ESD bag 100. In some implementations, the length (L) may be greater than or equal to 50.8 centimeters.

Figure 1F:
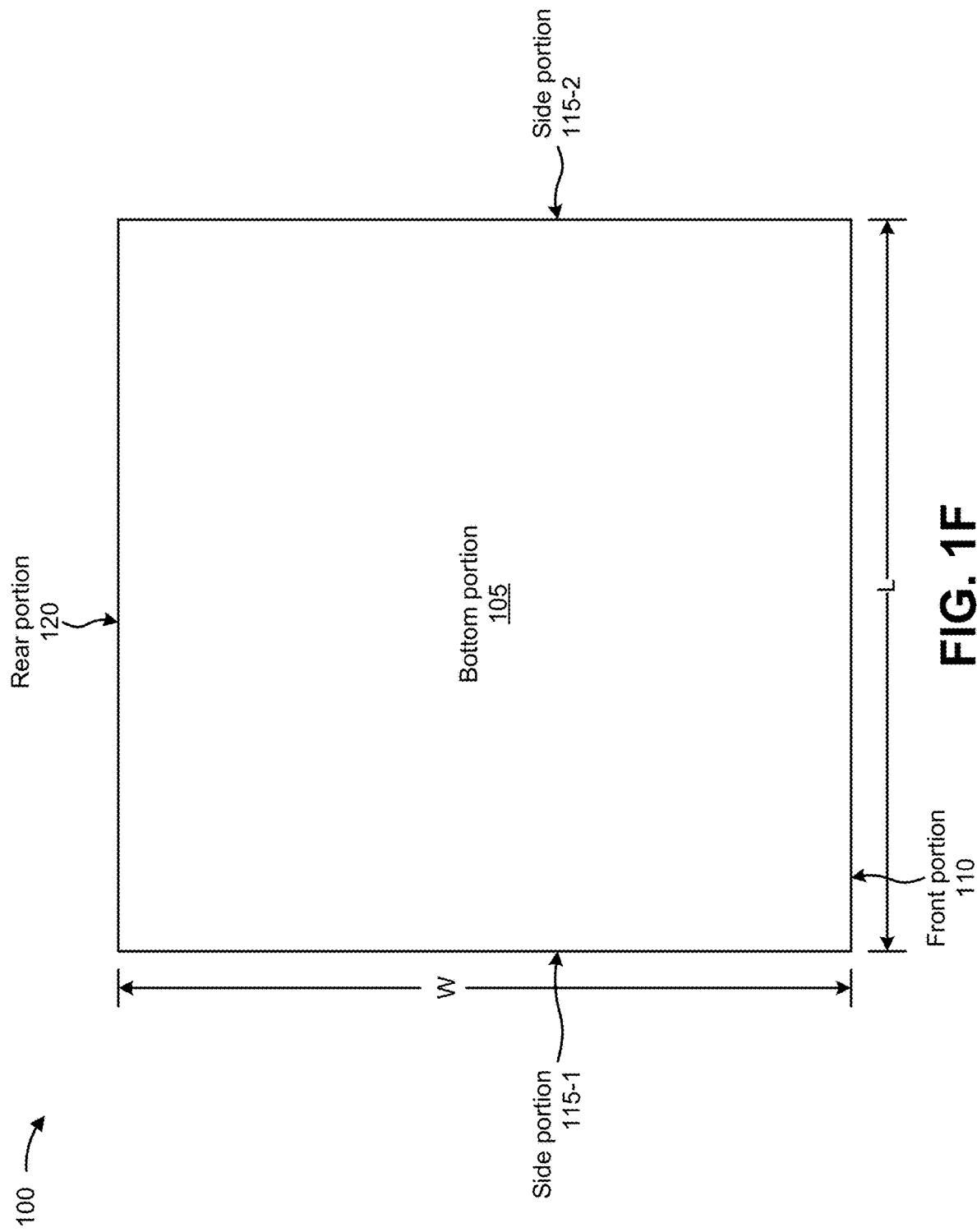

FIG. 1F is a bottom view of the ESD bag 100 that depicts the bottom portion 105 of the ESD bag 100. As shown in FIG. 1F, the bottom portion 105 may include the length (L) that depends on a size and/or a shape of the component to be stored in the ESD bag 100. In some implementations, the length (L) may be greater than or equal to 50.8 centimeters. The bottom portion 105 may include the width (W) that depends on a size and/or a shape of the component to be stored in the ESD bag 100. In some implementations, the width (W) may be greater than or equal to 50.8 centimeters.

As indicated above, FIGS. 1A-1F are provided as an example. Other examples may differ from what is described with regard to FIGS. 1A-1F. The number and arrangement of portions of the ESD bag 100 shown in FIGS. 1A-1F are provided as an example. In practice, there may be additional portions, fewer portions, different portions, or differently arranged portions than those shown in FIGS. 1A-1F.

FIGS. 2A-2D are diagrams of example steps 200 for providing and storing a component 205 (e.g., an FRU) in the ESD bag 100 depicted in FIGS. 1A-1F. The component 205 may include a component of a network device, such as an FRU of the network device. The network device may include one or more devices capable of receiving, processing, storing, routing, and/or providing traffic (e.g., a packet or other information or metadata) in a manner described herein. For example, the network device may include a router, such as a label switching router (LSR), a label edge router (LER), an ingress router, an egress router, a provider router (e.g., a provider edge router or a provider core router), a virtual router, a route reflector, an area border router, or another type of router. Additionally, or alternatively, the network device may include a gateway, a switch, a firewall, a hub, a bridge, a reverse proxy, a server (e.g., a proxy server, a cloud server, or a data center server), a load balancer, and/or a similar device. In some implementations, the network device may be a physical device implemented within a housing, such as a chassis. In some implementations, a group of network devices may be a group of data center nodes that are used to route traffic flow through a network.

Figure 2A:
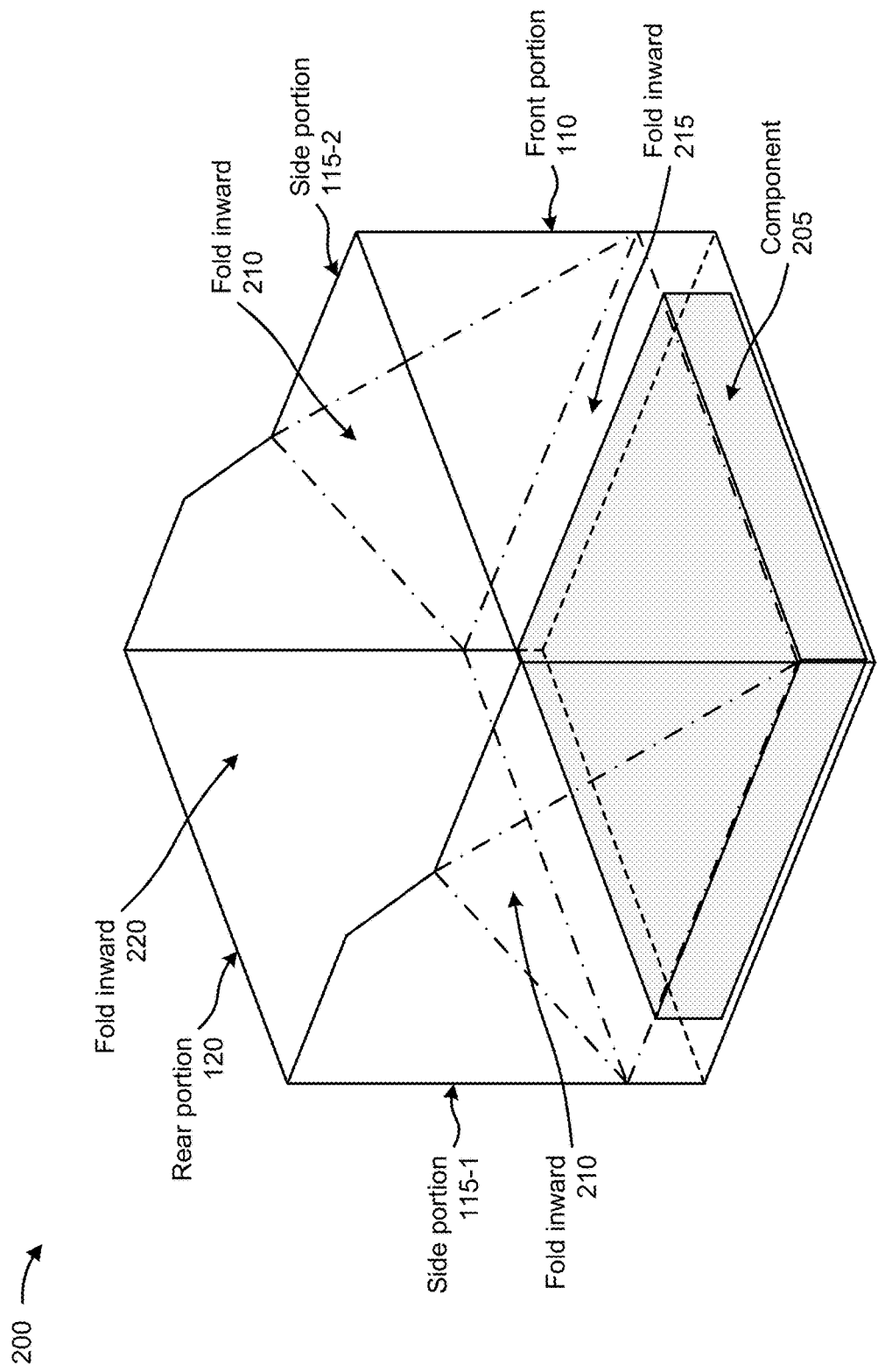

As shown in FIG. 2A, the component 205 may be placed in the ESD bag 100 and provided on the bottom portion 105 of the ESD bag 100. As shown by reference number 210, a force may be applied to the first side portion 115-1 and the second side portion 115-2 to cause the first side portion 115-1 and the second side portion 115-2 to fold inward and downward toward the component 205, via the pairs of outside-in creased edges 125 of the first side portion 115-1 and the second side portion 115-2. As indicated by reference number 215, the first side portion 115-1 and the second side portion 115-2 folding inward and downward may cause the front portion 110 to fold inward and downward toward the component 205, via the inside-out creased edges 130 of the front portion 110. As indicated by reference number 220, the first side portion 115-1 and the second side portion 115-2 folding inward and downward may cause the rear portion 120 to fold inward and downward toward the component 205, via the inside-out creased edges 130 of the rear portion 120.

Figure 2B:
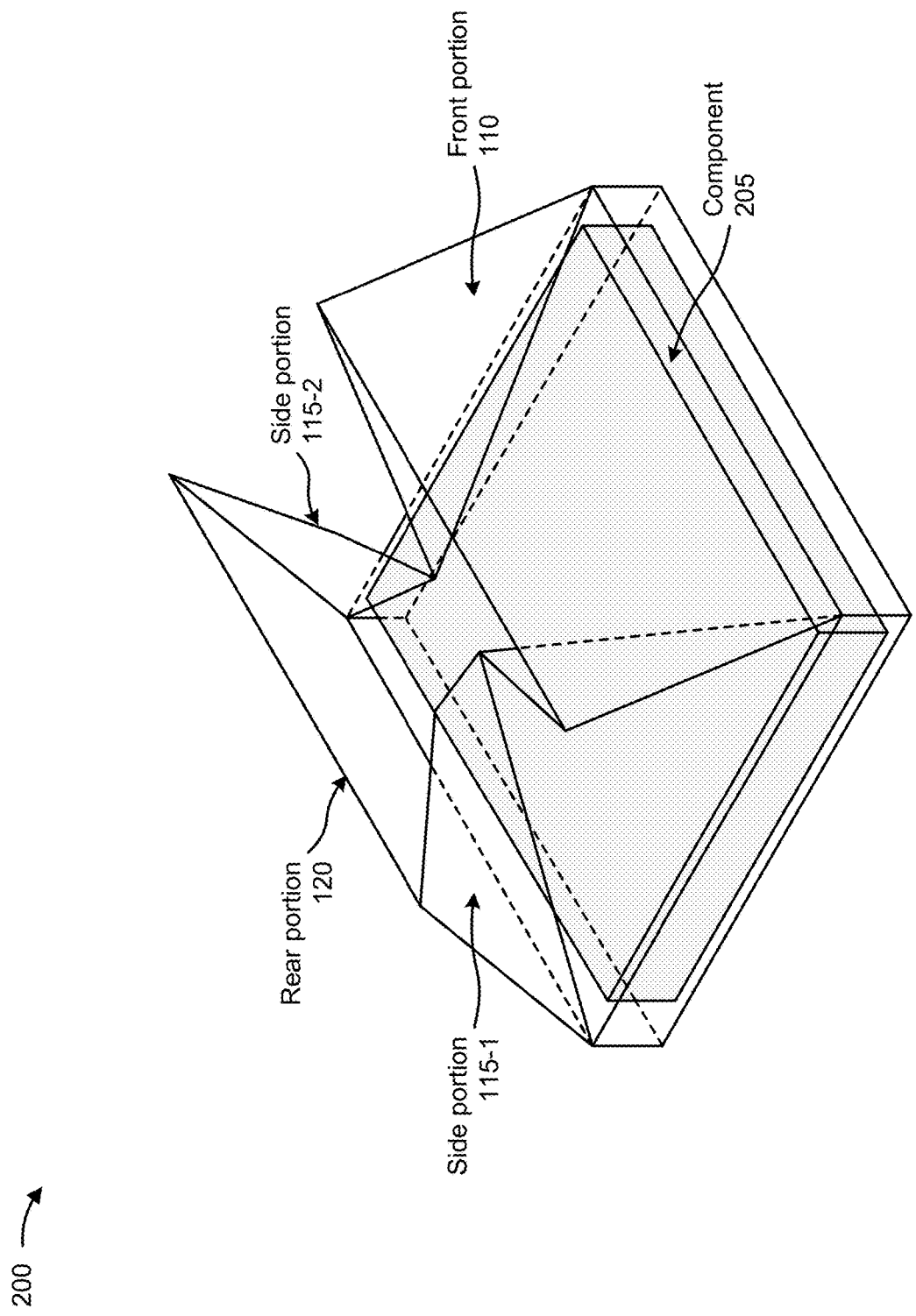

As shown in FIG. 2B, further applying the force to the first side portion 115-1 and the second side portion 115-2 may cause the first side portion 115-1, the second side portion 115-2, the front portion 110, and the rear portion 120 to further fold inward and downward toward the component 205. As shown in FIG. 2C, the force may be applied to the first side portion 115-1 and the second side portion 115-2 until the front portion 110 and the rear portion 120 lie flat on the component 205. Since the height of the rear portion 120 (e.g., the first height (H1)) is greater than the height of the front portion 110 (e.g., the second height (H2)), the rear portion 120 may overlap over the front portion 110 to form a seam. As shown in FIG. 2D, and by reference number 225, an adhesive material (e.g., an adhesive tape or fastener) may be applied to the seam to seal the component 205 in the ESD bag 100.

To remove the component 205 from the sealed ESD bag 100, the adhesive material may be removed from the seam, and the front portion 110 may pulled upward and away from the component 205. Pulling the front portion 110 away from the component 205 may cause the first side portion 115-1, the second side portion 115-2, and the rear portion 120 to move upward and away from the component 205 until the ESD bag 100 is in the free-standing position, as shown in FIG. 2A. Once the ESD bag 100 is in the free-standing position, the component 205 may be safely removed from the ESD bag 100.

In this way, the top-load ESD bag 100 may provide a safe and effective way to store and ship large and heavy components. For example, the ESD bag 100 may prevent damage to FRUs and may address handling challenges associated with providing large and heavy FRUs in and out of the ESD bag 100. This may enhance the client experience and avoid unintentional FRU damage from mishandling. The ESD bag 100 may include an open-top box design with predefined creases for easy and consistent wrapping and unwrapping of an FRU. The ESD bag 100 may simplify the FRU handling process based on loading and unloading the FRU into and from the ESD bag 100 and based on wrapping and unwrapping the FRU with the ESD bag 100. The ESD bag 100 may include a fully open top and four sides that are self-standing, which enables a single person to place a FRU into the ESD bag 100 with both hands, allowing for more control. The predefined creases of the ESD bag 100 may allow the person to use both hands to simultaneously push against two sides of the ESD bag 100, causing the ESD bag 100 to collapse onto itself. Finally, a single piece of adhesive material (e.g., tape) may be utilized to hold the ESD bag 100 closed. Thus, the top-load ESD bag 100 may prevent costly damage to vulnerable components (e.g., connectors) of FRUs, and may prevent causing inoperable FRUs, malfunctioning FRUs, and/or the like.

As indicated above, FIGS. 2A-2D are provided as an example. Other examples may differ from what is described with regard to FIGS. 2A-2D. The number and arrangement of portions of the ESD bag 100 shown in FIGS. 2A-2D are provided as an example. In practice, there may be additional portions, fewer portions, different portions, or differently arranged portions than those shown in FIGS. 2A-2D.

Figure 3:
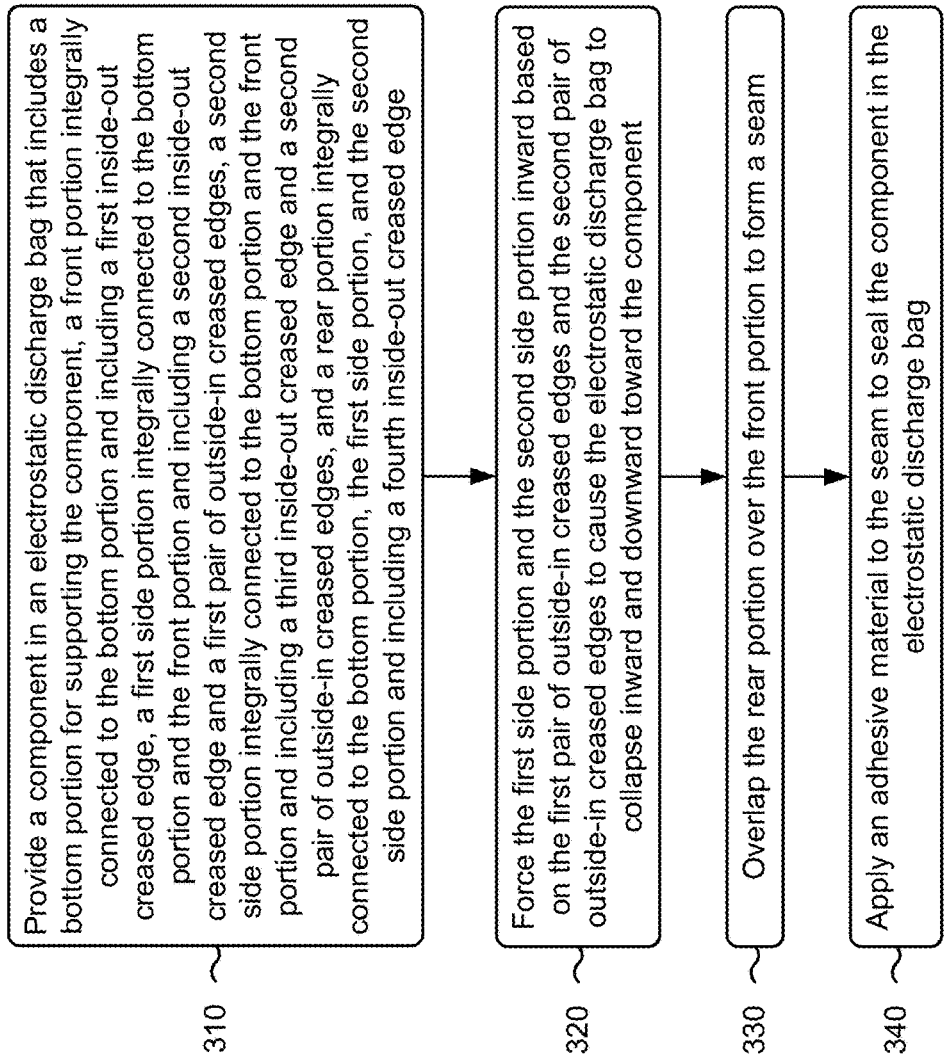
FIG. 3 is a flowchart of an example process for providing and storing a component (e.g., an FRU) in the ESD bag.

FIG. 3 is a flowchart of an example process 300 for providing and storing a component (e.g., an FRU) in the ESD bag. In some implementations, one or more process blocks of FIG. 3 may be performed with an ESD bag (e.g., the ESD bag 100).

As shown in FIG. 3, process 300 may include providing a component in an electrostatic discharge bag that includes a bottom portion for supporting the component, a front portion integrally connected to the bottom portion and including a first inside-out creased edge, a first side portion integrally connected to the bottom portion and the front portion and including a second inside-out creased edge and a first pair of outside-in creased edges, a second side portion integrally connected to the bottom portion and the front portion and including a third inside-out creased edge and a second pair of outside-in creased edges, and a rear portion integrally connected to the bottom portion, the first side portion, and the second side portion and including a fourth inside-out creased edge (block 310). For example, a component may be provided in an electrostatic discharge bag that includes a bottom portion for supporting the component, a front portion integrally connected to the bottom portion and including a first inside-out creased edge, a first side portion integrally connected to the bottom portion and the front portion and including a second inside-out creased edge and a first pair of outside-in creased edges, a second side portion integrally connected to the bottom portion and the front portion and including a third inside-out creased edge and a second pair of outside-in creased edges, and a rear portion integrally connected to the bottom portion, the first side portion, and the second side portion and including a fourth inside-out creased edge, as described above.

In some implementations, the electrostatic discharge bag forms an opening for receiving the component. In some implementations, the electrostatic discharge bag is self-standing for receiving the component. In some implementations, the electrostatic discharge bag is sized based on a size of the component to be provided in the electrostatic discharge bag. In some implementations, each of the bottom portion, the front portion, the first side portion, the second side portion, and the rear portion includes a thickness that is greater than or equal to 0.0762 millimeters.

In some implementations, a height of the rear portion is greater than a height of the front portion. In some implementations, the electrostatic discharge bag wraps the component based on the first pair of outside-in creased edges and the second pair of outside-in creased edges collapsing inward and downward toward the bottom portion. In some implementations, the electrostatic discharge bag is to store and protect the component from electrostatic discharge. In some implementations, the bottom portion includes a length of greater than or equal to 50.8 centimeters and a width of greater than or equal to 50.8 centimeters.

In some implementations, a height of the front portion is greater than or equal to 32.512 centimeters. In some implementations, a height of the rear portion is greater than or equal to 38.1 centimeters. In some implementations, the first inside-out creased edge of the front portion is provided at a height of greater than or equal to 7.112 centimeters along a height of the front portion. In some implementations, the second inside-out creased edge of the first side portion is provided at a height of greater than or equal to 7.112 centimeters along a height of the first side portion. In some implementations, the third inside-out creased edge of the second side portion is provided at a height of greater than or equal to 7.112 centimeters along a height of the second side portion. In some implementations, the fourth inside-out creased edge of the rear portion is provided at a height of greater than or equal to 7.112 centimeters along a height of the rear portion.

In some implementations, a height of a first section of the first side portion is greater than or equal to 38.1 centimeters and a height of a second section of the first side portion is greater than or equal to 32.512 centimeters. In some implementations, a height of a first section of the second side portion is greater than or equal to 38.1 centimeters and a height of a second section of the second side portion is greater than or equal to 32.512 centimeters. In some implementations, the electrostatic discharge bag includes a static shielding film material.

As further shown in FIG. 3, process 300 may include forcing the first side portion and the second side portion inward based on the first pair of outside-in creased edges and the second pair of outside-in creased edges to cause the electrostatic discharge bag to collapse inward and downward toward the component (block 320). For example, the first side portion and the second side portion may be forced inward based on the first pair of outside-in creased edges and the second pair of outside-in creased edges to cause the electrostatic discharge bag to collapse inward and downward toward the component, as described above.

As further shown in FIG. 3, process 300 may include overlapping the rear portion over the front portion to form a seam (block 330). For example, the rear portion may be overlapped over the front portion to form a seam, as described above.

As further shown in FIG. 3, process 300 may include applying an adhesive material to the seam to seal the component in the electrostatic discharge bag (block 340). For example, an adhesive material may be applied to the seam to seal the component in the electrostatic discharge bag, as described above.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

The foregoing disclosure provides illustration and description but is not intended to be exhaustive or to limit the implementations to the precise form disclosed. Modifications may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. An electrostatic discharge bag, comprising:
   a bottom portion;
   a front portion integrally connected to the bottom portion and including a first inside-out creased edge above the bottom portion;
   a first side portion integrally connected to the bottom portion and the front portion and including a second inside-out creased edge above the bottom portion and a first pair of outside-in creased edges,
      wherein the first pair of outside-in creased edges converge toward a top edge of the first side portion;
   a second side portion integrally connected to the bottom portion and the front portion and including a third inside-out creased edge above the bottom portion and a second pair of outside-in creased edges,
      wherein the first pair of outside-in creased edges and the second pair of outside-in creased edges enable the electrostatic discharge bag to collapse inward and downward toward the bottom portion; and
   a rear portion integrally connected to the bottom portion, the first side portion, and the second side portion and including a fourth inside-out creased edge above the bottom portion.

2. The electrostatic discharge bag of claim 1, wherein the electrostatic discharge bag forms an opening for receiving a component.

3. The electrostatic discharge bag of claim 1, wherein the electrostatic discharge bag is self-standing for receiving a component.

4. The electrostatic discharge bag of claim 1, wherein the electrostatic discharge bag is sized based on a size of a component to be provided in the electrostatic discharge bag.

5. The electrostatic discharge bag of claim 1, wherein each of the bottom portion, the front portion, the first side portion, the second side portion, and the rear portion includes a thickness that is greater than or equal to 0.0762 millimeters.

6. The electrostatic discharge bag of claim 1, wherein a height of the rear portion is greater than a height of the front portion.

7. The electrostatic discharge bag of claim 1, wherein the electrostatic discharge bag wraps a component based on the first pair of outside-in creased edges and the second pair of outside-in creased edges collapsing inward and downward toward the bottom portion.

8. The electrostatic discharge bag of claim 1, wherein the electrostatic discharge bag is to store and protect a component from electrostatic discharge.

9. The electrostatic discharge bag of claim 1, wherein the bottom portion includes a length of greater than or equal to 50.8 centimeters and a width of greater than or equal to 50.8 centimeters.

10. The electrostatic discharge bag of claim 1, wherein a height of the front portion is greater than or equal to 32.512 centimeters.

11. The electrostatic discharge bag of claim 1, wherein a height of the rear portion is greater than or equal to 38.1 centimeters.

12. The electrostatic discharge bag of claim 1, wherein the first inside-out creased edge of the front portion is provided at a height of greater than or equal to 7.112 centimeters along a height of the front portion.

13. The electrostatic discharge bag of claim 1, wherein the second inside-out creased edge of the first side portion is provided at a height of greater than or equal to 7.112 centimeters along a height of the first side portion.

14. The electrostatic discharge bag of claim 1, wherein the third inside-out creased edge of the second side portion is provided at a height of greater than or equal to 7.112 centimeters along a height of the second side portion.

15. The electrostatic discharge bag of claim 1, wherein the fourth inside-out creased edge of the rear portion is provided at a height of greater than or equal to 7.112 centimeters along a height of the rear portion.

16. The electrostatic discharge bag of claim 1, wherein a height of a first section of the first side portion is greater than or equal to 38.1 centimeters and a height of a second section of the first side portion is greater than or equal to 32.512 centimeters.

17. The electrostatic discharge bag of claim 1, wherein a height of a first section of the second side portion is greater than or equal to 38.1 centimeters and a height of a second section of the second side portion is greater than or equal to 32.512 centimeters.

18. The electrostatic discharge bag of claim 1, wherein the electrostatic discharge bag includes a static shielding film material.

19. A system, comprising:
   a component; and
   an electrostatic discharge bag that includes:
      a bottom portion for supporting the component,
      a front portion integrally connected to the bottom portion and including a first inside-out creased edge above the bottom portion,
      a first side portion integrally connected to the bottom portion and the front portion and including a second inside-out creased edge above the bottom portion and a first pair of outside-in creased edges,
         wherein the first pair of outside-in creased edges converge toward a top edge of the first side portion,
      a second side portion integrally connected to the bottom portion and the front portion and including a third inside-out creased edge above the bottom portion and a second pair of outside-in creased edges,
wherein the first pair of outside-in creased edges and the second pair of outside-in creased edges enable the electrostatic discharge bag to collapse inward and downward toward the component supported by the bottom portion, and
a rear portion integrally connected to the bottom portion, the first side portion, and the second side portion and including a fourth inside-out creased edge above the bottom portion.

20. A method, comprising:
providing a component in an electrostatic discharge bag that includes:
  a bottom portion for supporting the component,
  a front portion integrally connected to the bottom portion and including a first inside-out creased edge above the bottom portion,
  a first side portion integrally connected to the bottom portion and the front portion and including a second inside-out creased edge above the bottom portion and a first pair of outside-in creased edges, wherein the first pair of outside-in creased edges converge toward a top edge of the first side portion,
  a second side portion integrally connected to the bottom portion and the front portion and including a third inside-out creased edge above the bottom portion and a second pair of outside-in creased edges, and
  a rear portion integrally connected to the bottom portion, the first side portion, and the second side portion and including a fourth inside-out creased edge above the bottom portion;
forcing the first side portion and the second side portion inward based on the first pair of outside-in creased edges and the second pair of outside-in creased edges to cause the electrostatic discharge bag to collapse inward and downward toward the component;
overlapping the rear portion over the front portion to form a seam; and
applying an adhesive material to the seam to seal the component in the electrostatic discharge bag.

* * * * *